US012813232B2

(12) United States Patent
Chiu et al.

(10) Patent No.: US 12,813,232 B2
(45) Date of Patent: Nov. 24, 2026

(54) METHOD FOR FORMING SEMICONDUCTOR STRUCTURE

(71) Applicant: Winbond Electronics Corp., Taichung City (TW)

(72) Inventors: Pin-Han Chiu, Hsinchu City (TW); Feng-Jung Chang, Nantou County (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 856 days.

(21) Appl. No.: 18/321,254

(22) Filed: May 22, 2023

(65) Prior Publication Data

US 2023/0386843 A1 Nov. 30, 2023

(30) Foreign Application Priority Data

May 30, 2022 (TW) ................................. 111120048

(51) Int. Cl.
*H10P 76/40* (2026.01)
*H10P 50/00* (2026.01)

(52) U.S. Cl.
CPC ........ *H10P 76/4085* (2026.01); *H10P 50/695* (2026.01); *H10P 76/4083* (2026.01)

(58) Field of Classification Search
CPC . H10P 76/4085; H10P 50/695; H10P 76/4083
See application file for complete search history.

(56) References Cited

U.S. PATENT DOCUMENTS

| | | | |
|---|---|---|---|
| 8,466,066 B2 | 6/2013 | Kim | |
| 8,541,316 B2 * | 9/2013 | Sukekawa | H10P 50/73 438/421 |
| 8,772,167 B2 | 7/2014 | Seo et al. | |
| 9,034,765 B2 | 5/2015 | Park et al. | |
| 9,129,860 B2 | 9/2015 | Fukuzumi et al. | |
| 9,159,560 B2 | 10/2015 | Seo | |
| 9,929,013 B2 * | 3/2018 | Kim | H10P 76/4085 |
| 10,096,603 B2 | 10/2018 | Kim et al. | |
| 10,622,363 B2 | 4/2020 | Sills | |

(Continued)

FOREIGN PATENT DOCUMENTS

| | | |
|---|---|---|
| TW | 202101596 A | 1/2021 |
| TW | 202215607 A | 4/2022 |

*Primary Examiner* — Jay C Chang

(74) *Attorney, Agent, or Firm* — MUNCY, GEISSLER, OLDS & LOWE, P.C.

(57) ABSTRACT

A method for forming a semiconductor structure includes forming strip patterns over a semiconductor substrate, and forming a patterned mask layer over the strip patterns. The first openings are arranged in an array. A pitch of the first openings in the first direction is smaller than a pitch of the first openings in a second direction. A first dimension of the first openings in the first direction is longer than a second dimension of the first openings in the second direction. The method also includes forming spacers to partially fill the first openings, removing the patterned mask layer to form trenches between the spacers, forming a conformal layer to cover the spacers and partially fill the first openings and the trenches, and etching the strip patterns using the conformal layer and the spacers as a mask, thereby cutting the strip patterns into island patterns.

20 Claims, 17 Drawing Sheets

(56) References Cited

U.S. PATENT DOCUMENTS

| | | | | |
|---|---|---|---|---|
| 2012/0156841 | A1* | 6/2012 | Lee | H10B 41/41<br>438/257 |
| 2020/0027827 | A1 | 1/2020 | Lin et al. | |
| 2022/0059543 | A1 | 2/2022 | Mun et al. | |
| 2022/0328304 | A1* | 10/2022 | Kau | G03F 1/36 |
| 2023/0337417 | A1* | 10/2023 | Tseng | H10B 12/09 |

* cited by examiner

METHOD FOR FORMING SEMICONDUCTOR STRUCTURE

CROSS REFERENCE TO RELATED APPLICATIONS

This application claims the benefit of Taiwan Patent Application No. 111120048 filed on May 30, 2022, entitled "METHOD FOR FORMING SEMICONDUCTOR STRUCTURE" which is hereby incorporated herein by reference.

BACKGROUND

Field of the Disclosure

The present disclosure relates to a method for forming a semiconductor structure, and in particular, it relates to the active regions of the semiconductor structure.

Description of the Related Art

In order to increase DRAM density and improve its performance, existing technologies for fabricating DRAM devices continue focusing on scaling down the DRAM's size.

SUMMARY

The method of forming a semiconductor structure includes forming strip patterns over a semiconductor substrate, and forming a patterned mask layer over the strip patterns. The patterned mask layer includes first openings corresponding to the strip patterns. The first openings are arranged in an array in a first direction and a second direction. The second direction is perpendicular to the first direction. The first pitch of the first openings in the first direction is smaller than a second pitch of the first openings in the second direction. A first dimension of at least one of the first openings in the first direction is longer than a second dimension of the at least one of the first openings in the second direction. The method also includes forming spacers to partially fill the first openings, removing the patterned mask layer to form trenches between the spacers, forming a conformal layer to cover the spacers and partially fill the first openings and the trenches, and etching the strip patterns using the conformal layer and the spacers as a mask, thereby cutting the strip patterns into island patterns.

The method of forming a semiconductor structure includes forming first strip patterns over a semiconductor substrate, forming a hard mask layer over the first strip patterns, forming a photoresist material over the hard mask layer, and patterning the photoresist material using a photomask so that patterns of the photomask are transferred into the photoresist material to form a patterned photoresist material. At least one of the patterns of the photomask includes a body portion and an extending portion protruding from a side of the body portion. The patterned photoresist material has first openings corresponding to the first strip patterns. The method also includes forming spacers along sidewalls of the first openings, removing the patterned photoresist material, forming a conformal layer over the hard mask layer and along the spacers, and sequentially etching the hard mask layer, the first strip patterns and the semiconductor substrate using the conformal layer and the spacers as a mask.

BRIEF DESCRIPTION OF THE DRAWINGS

In accordance with some embodiments of the present disclosure, it can be further understood by reading the subsequent detailed description and examples with references made to the accompanying drawings, wherein:

FIGS. 1A, 2A and 4A-9A illustrate plan views of forming a semiconductor structure at various stages, in accordance with some embodiments of the present disclosure.

FIGS. 1B, 2B and 4B-9B illustrate cross-sectional views forming a semiconductor structure at various stages, in accordance with some embodiments of the present disclosure.

DETAILED DESCRIPTION

FIGS. 1A, 2A and 4A-9A illustrate plan views of forming a semiconductor structure at various stages, in accordance with some embodiments. The plan views only show some components of the semiconductor structure for brevity and clarity. Some other components of the semiconductor structure may be shown in the cross-sectional views of FIGS. 1B, 2B and 4B-9B.

For ease of illustration, FIGS. 1A, 2A and 4A-9A illustrate reference directions, in that directions A, B, C and D are horizontal directions. The first direction A is parallel to the extending direction of the bit lines and parallel to the row direction of an array formed by core patterns. The core patterns are mask patterns used in a patterning process for forming active regions. The second direction B is parallel to the extending direction of the word lines and parallel to the column direction of the array formed by the core patterns. The first direction A is substantially perpendicular to the second direction B. The third direction C is parallel to the diagonal direction of the array formed by the core patterns. The third direction C intersects the second direction B with an acute angle. The fourth direction D is parallel to the direction in which the active regions extend. The fourth direction D intersects the second direction B with an acute angle that is greater than the acute angle between the third direction C and the second direction B.

FIGS. 1A, 2A and 4A-9A further illustrate reference cross-sections, in that cross-section A-A' is a plane that is parallel to the first direction A and passes through a column of the core patterns, cross-section B-B' is a plane that is parallel to the second direction B and passes through a row of the core patterns, cross-section C-C' is a plane that is parallel to the third direction C and passes through the core patterns disposed on the diagonal of the array, and cross-section D-D' is a plane that is parallel to the fourth direction D and passes through active regions. FIGS. 1B, 2B and 4B-9B illustrate cross-sectional views of the semiconductor structure taken along cross-sections A-A', B-B', C-C' and D-D' of in FIGS. 1A, 1B and 4A-9A.

Figure 1A:
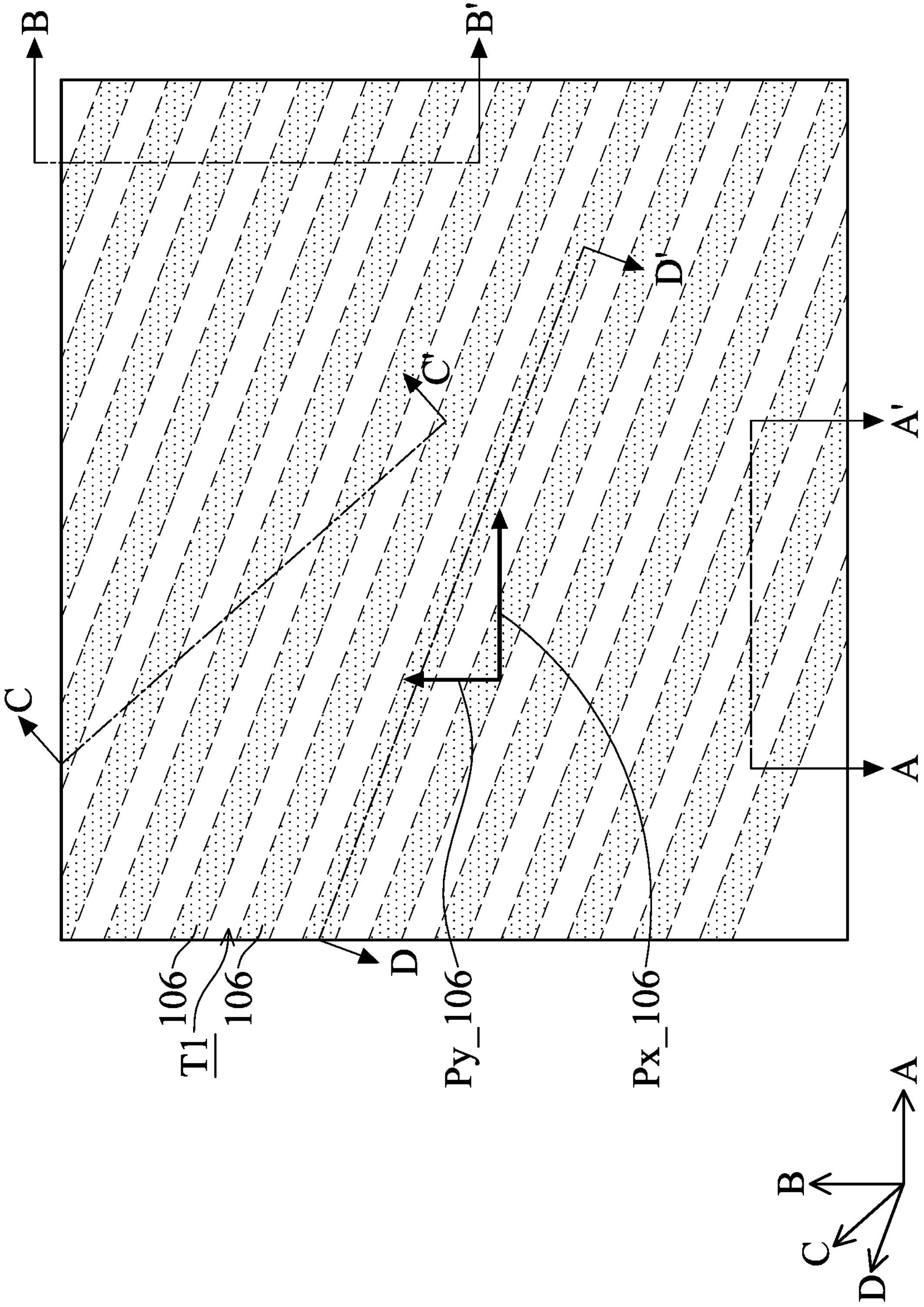
Figure 1B:
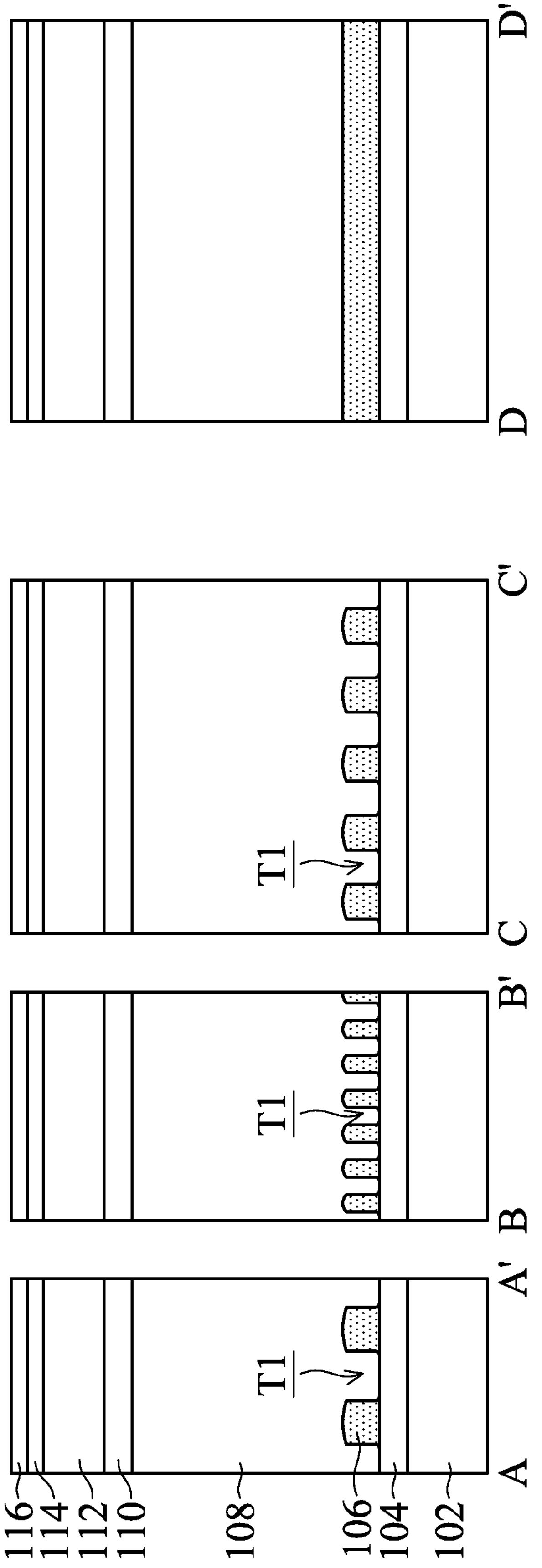

A semiconductor substrate 102 is provided, as shown in FIG. 1B. In some embodiments, the semiconductor substrate 102 is an elemental semiconductor substrate, such as a silicon substrate, or a germanium substrate; or a compound semiconductor substrate, such as a silicon carbide substrate, or a gallium arsenide substrate.

A first hard mask layer 104 is formed over the semiconductor substrate 102, as shown in FIG. 1B. In some embodiments, the first hard mask layer 104 is made of dielectric material, such as silicon oxynitride (SiON), silicon oxide (SiO), or silicon nitride (SiN).

A first patterned mask layer 106 is formed over the first hard mask layer 104, as shown in FIGS. 1A and 1B. The first patterned mask layer 106 includes a plurality of strip patterns spaced substantially equidistant from each other, with trenches T1 between the strip patterns. The trenches T1 expose the first hard mask layer 104. The strip patterns of the first patterned mask layer 106 and the trenches T1 extend in the fourth direction D. The strip patterns of the first patterned mask layer 106 have a pitch Px_106 in the first direction A and a pitch Py_106 in the second direction B. The pitch Py_106 may be smaller than the pitch Px_106. As used herein, pitch refers to the sum of the size of one pattern itself and the distances between adjacent patterns in a particular direction. In some embodiments, the first patterned mask layer 106 is made of semiconductor material, such as polysilicon.

A second hard mask layer 108, a third hard mask layer 110, a fourth hard mask layer 112, a fifth hard mask layer 114 and a sixth hard mask layer 116 are sequentially formed over the first hard mask layer 106, as shown in FIG. 1B. The second hard mask layer 108 fills the trenches T1. In some embodiments, the second hard mask layer 108 and the fourth hard mask layer 112 may be made of a carbon-rich material, such as carbon, amorphous carbon, spin-on carbon (SOC), spin-on hard mask (SOH), organic dielectric layer (ODL). In some embodiments, the third hard mask layer 110 may be made of silicon-rich material, for example, silicon-rich anti-reflective layers (Si-BARC), silicon oxynitride (SiON). In some embodiments, the fifth hard mask layer 114 and the sixth hard mask layer 116 are anti-reflective layers, for example, made of silicon-rich anti-reflective layers (Si-BARC), silicon oxynitride (SiON).

Figure 2A:
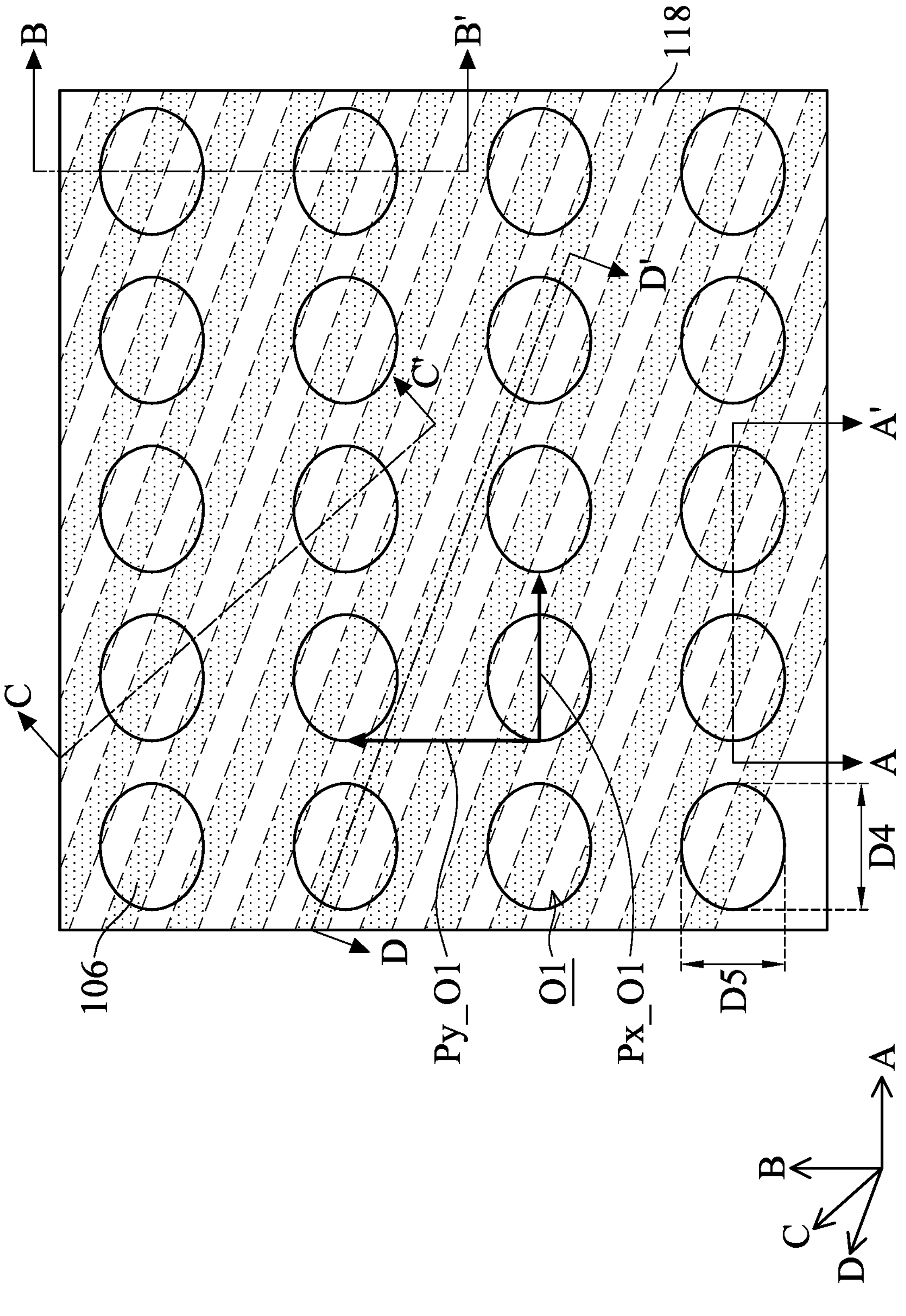
Figure 2B:
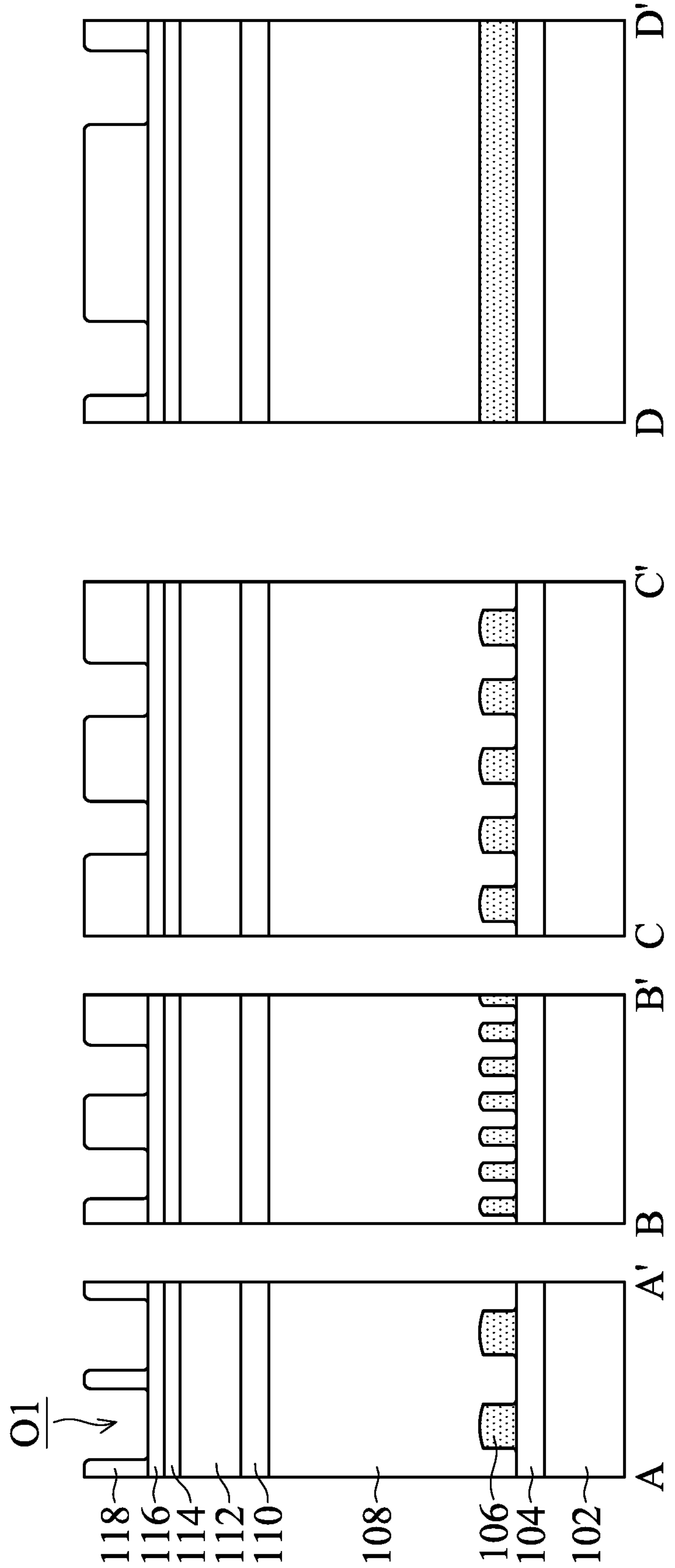

A second patterned mask layer 118 is formed over the sixth hard mask layer 116, as shown in FIGS. 2A and 2B. The second patterned mask layer 118 has a plurality of openings O1 that are spaced apart from each other and expose the sixth hard mask layer 116. The second patterned mask layer 118 may also be referred to as a core layer, and the openings O1 may also be referred to as core patterns. The second patterned mask layer 118 may be made of a photoresist material. For example, a lithography process is performed to form the second patterned mask layer 118. The lithography process includes forming a photoresist material on the sixth hard mask layer 116 using a spin coating process, and exposing the photoresist material to light by using a photomask.

Figure 3B:
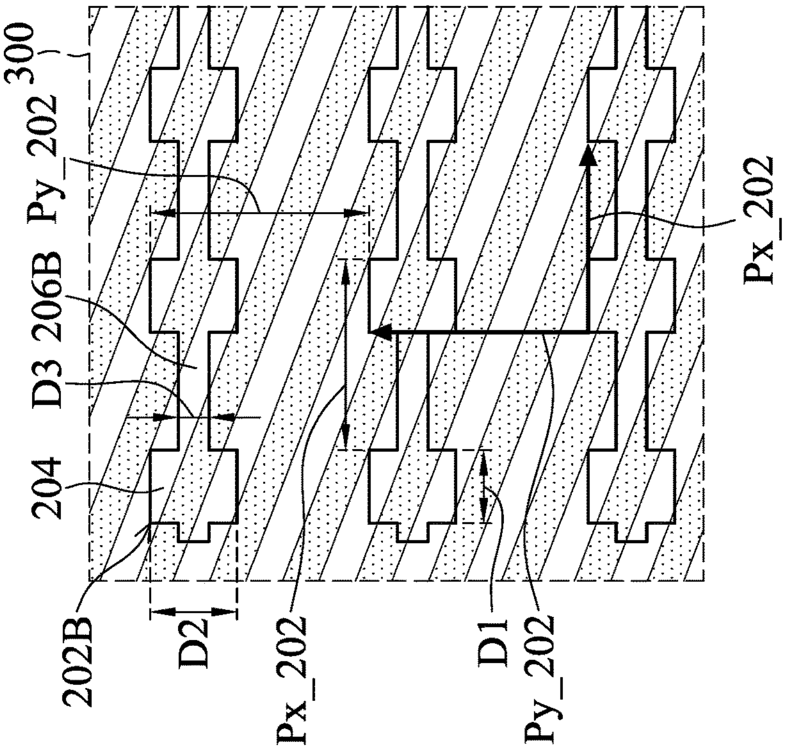
FIGS. 3A and 3B illustrate photomasks used in a lithography process, in accordance with some embodiments of the present disclosure.
Figure 3A:
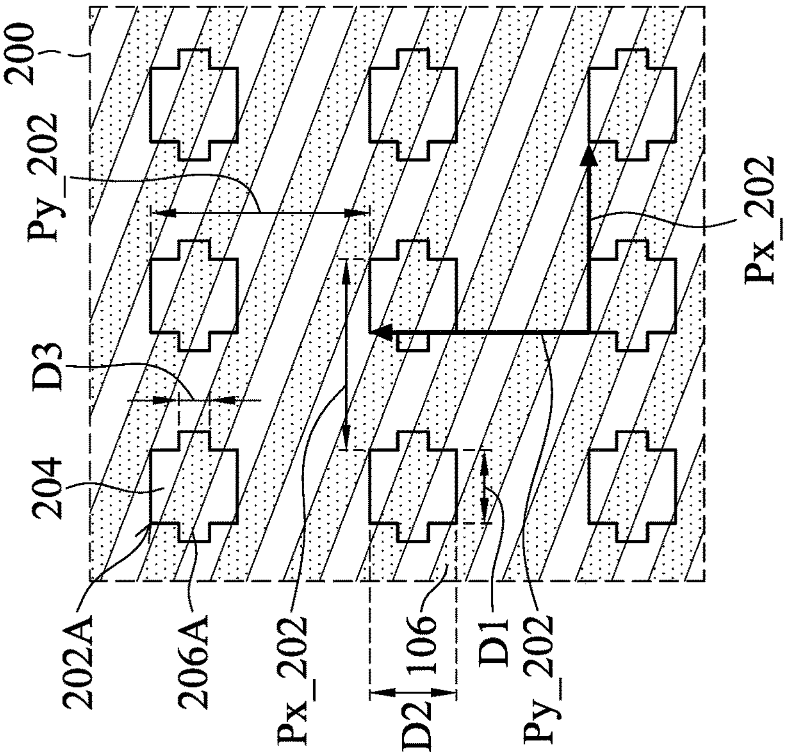

FIG. 3A illustrates a photomask 200 used in the lithography process for forming the second patterned mask layer 118, in accordance with some embodiments. The photomask 200 has patterns 202A which may be a light-transmitting area or a non-light-transmitting area, depending on whether a positive photoresist material or a negative photoresist material is used in the lithography process. FIG. 3A also illustrates the overlay relationship between the patterns 202A and the first patterned mask layer 106 during the lithography process. The patterns 202A are aligned with the strip patterns of the first patterned mask layer 106. The patterns 202A are arranged in an array in the first direction A and the second direction B. The pattern 202A has a pitch Px_202 in the first direction A, and a pitch Py_202 in the second direction B. The pitch Py_202 is longer than the pitch Px_202.

The patterns 202A have body portions 204 and extending portions 206A which protrude from opposite sides of the body portions 204 with respect to the first direction A. The body portions 204 have a dimension D1 in the first direction A and a dimension D2 in the second direction B. The dimension D1 is smaller than the dimension D2. The extending portions 206A have a dimension D3 in the second direction B. The dimension D3 is smaller than the dimensions D1 and D2. The dimension D3 of the extending portions 206A is smaller than the optical proximity correction (OPC) limit of the lithography process. For example, in some embodiments in which a 193 nm ArF lithography process is used, the dimension D3 of the extending portions 206A is smaller than 20 nm.

FIG. 3B illustrates a photomask 300 for forming the second patterned mask layer 118 shown in FIGS. 2A and 2B, in accordance with other embodiments of the present disclosure. The difference between the photomask 300 in FIG. 3B and the photomask 200 in FIG. 3A is that the extending portions 206B of the patterns 202B of the photomask 300 can further extend in the first direction A until the extending portions 206B of adjacent patterns 202B are connected to each other.

After the photomask 200 or the photomask 300 is used to expose the photoresist material, the photoresist material may be developed to remove the exposed or unexposed part of the photoresist material, depending on whether a positive photoresist material or a negative photoresist material is used in the lithography process. The patterns 202A (or 202B) are transferred into the photoresist material to form the openings O1. In some other embodiments, the second patterned mask layer 118 may be made of a hard mask layer. For example, a hard mask layer may be formed using a deposition process. A patterned photoresist layer may be formed on the hard mask layer using a lithography process, and then the hard mask layer is etched using the patterned photoresist layer to form second patterned mask layer 118 with the openings O1.

Referring back to FIGS. 2A and 2B, the openings O1 of the second patterned mask layer 118 are arranged in an array in the first direction A and the second direction B. The openings O1 overlap the strip patterns of the first patterned mask layer 106. The openings O1 have a pitch Px_O1 in the first direction A and a pitch Py_O1 in the second direction B. The pitch Py_O1 is longer than the pitch Px_O1. The pitch Px_O1 is substantially equal to the pitch Px_106 of the strip patterns. The pitch Py_O1 is longer than the pitch Py_106 of the strip patterns, for example, the pitch Py_O1 is about twice the pitch Py_106. The ratio of the pitch Px_O1 to Py_O1 may be in a range from about 0.75 to about 0.95.

The openings O1 have a dimension D4 in the first direction A and a dimension D5 in the second direction B. Since the patterns 202A (or 202B) of the photomask used in the lithography process have the extending portions 206A (or 206B), the openings O1 are formed with the larger dimension D4 than the dimension D5. The openings O1 have oval-like outlines or eye-like outlines. The ratio of the dimension D4 to the dimension D5 may be in a range from about 1.1 to about 1.5. In addition, the distance between the openings O1 in the first direction A is smaller than the distance between the openings O1 in the second direction B.

Figure 4A:
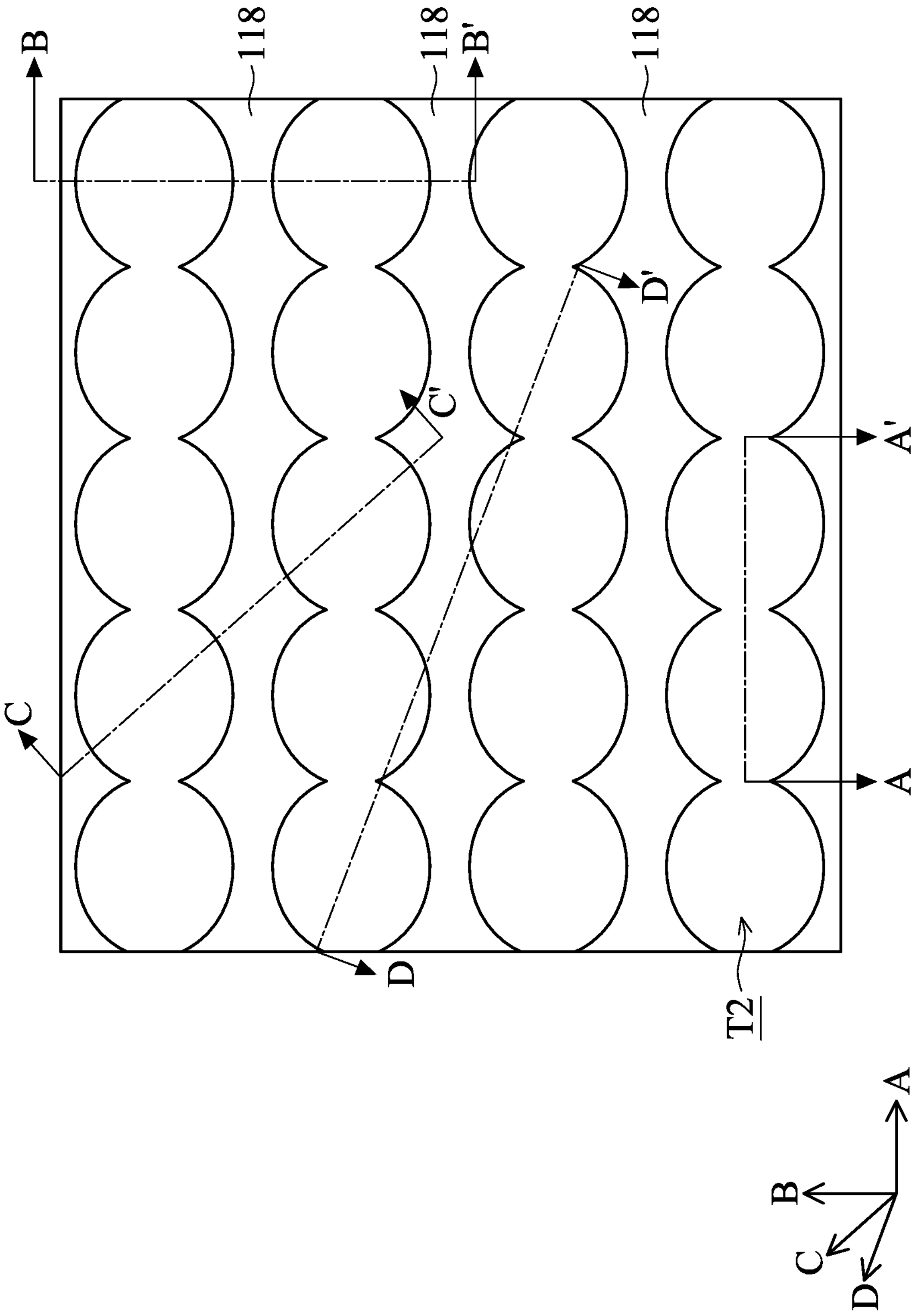
Figure 4B:
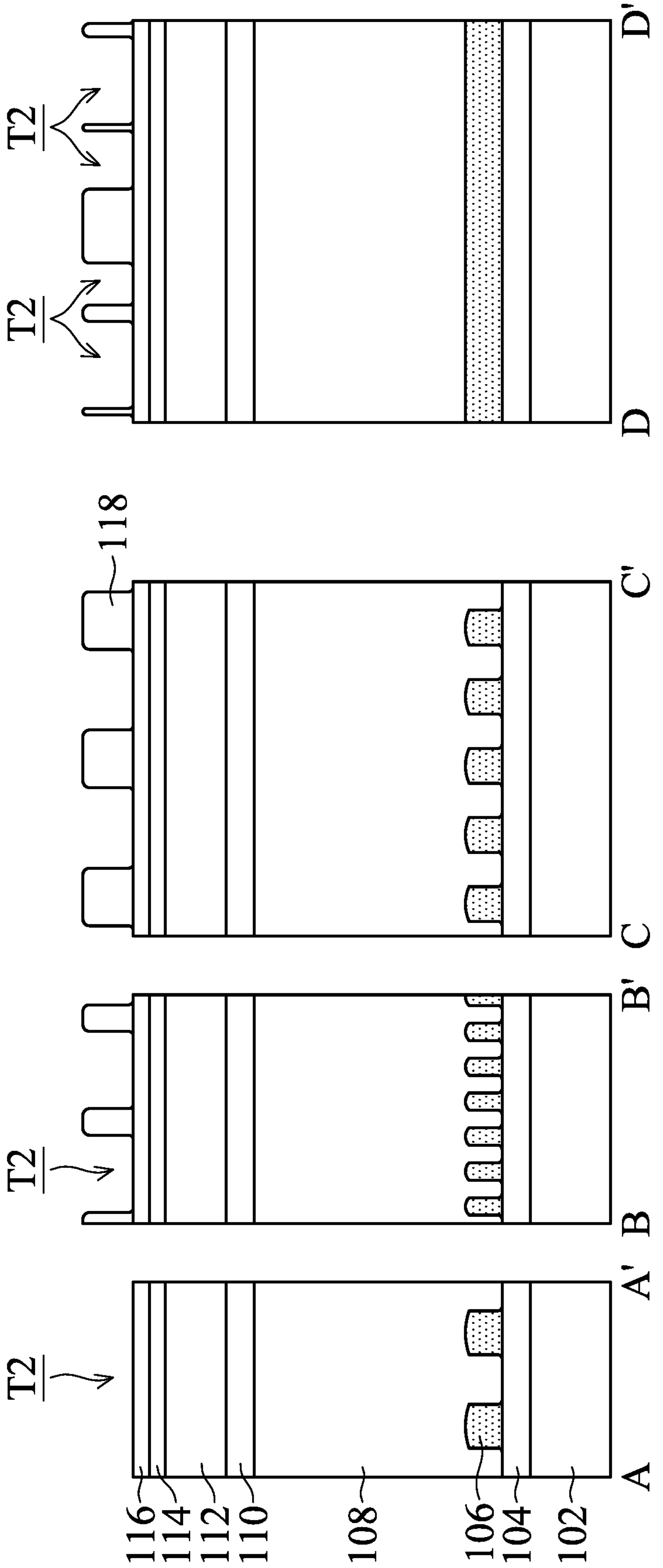

A trimming process is performed on the second patterned mask layer 118 to enlarge the openings O1 in the first direction A and the second direction B, as shown in FIGS. 4A and 4B. The trimming process may be an oxidation process or an etching process. Due to the expansion in size in the first direction, adjacent openings O1 are connected to each other, so that several openings O1 in one column are merged into one trench T2. The second patterned mask layer 118 is cut by the trenches T2 into a plurality of strip patterns that extend in the first direction A and are spaced apart from each other.

Figure 5A:
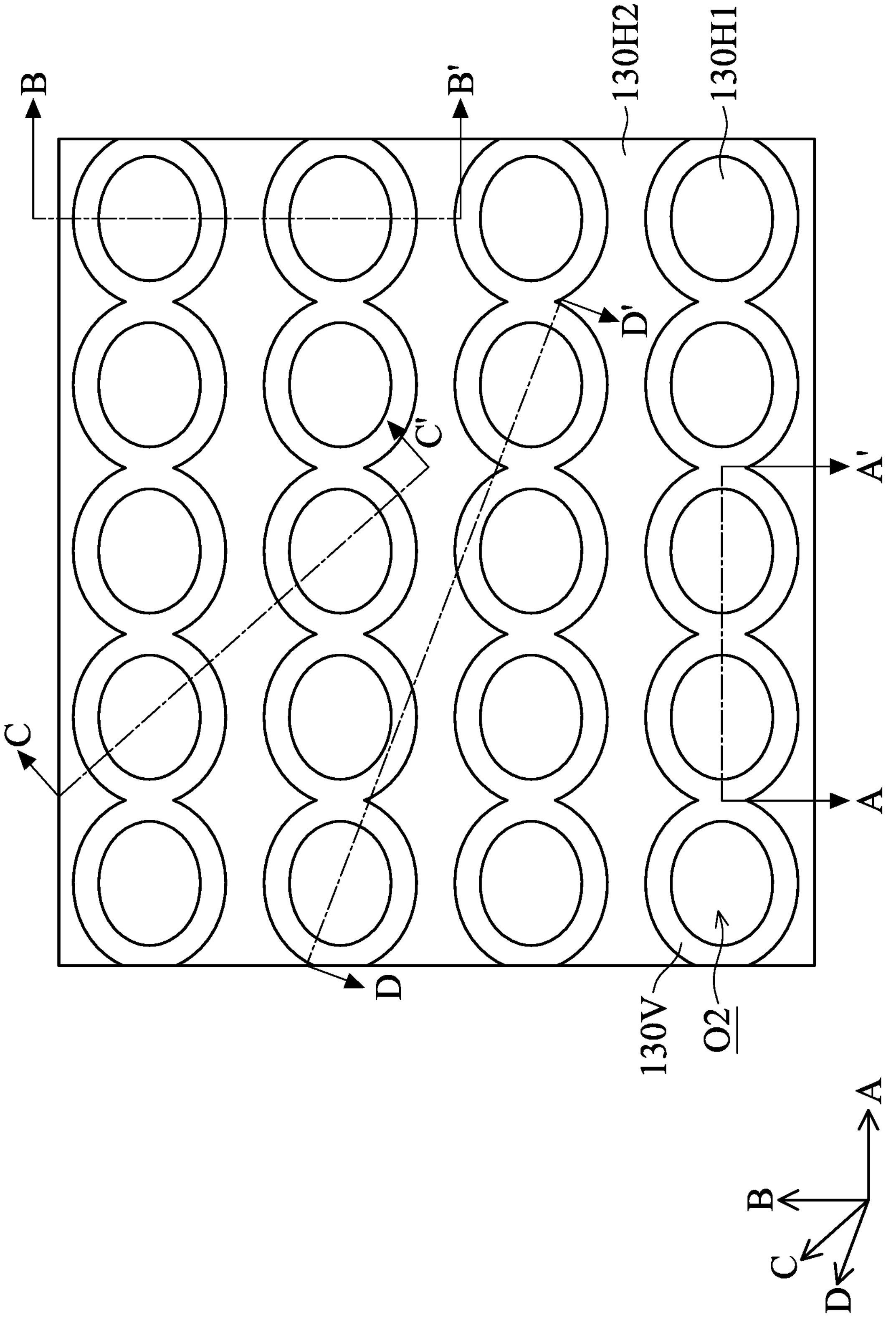
Figure 5B:
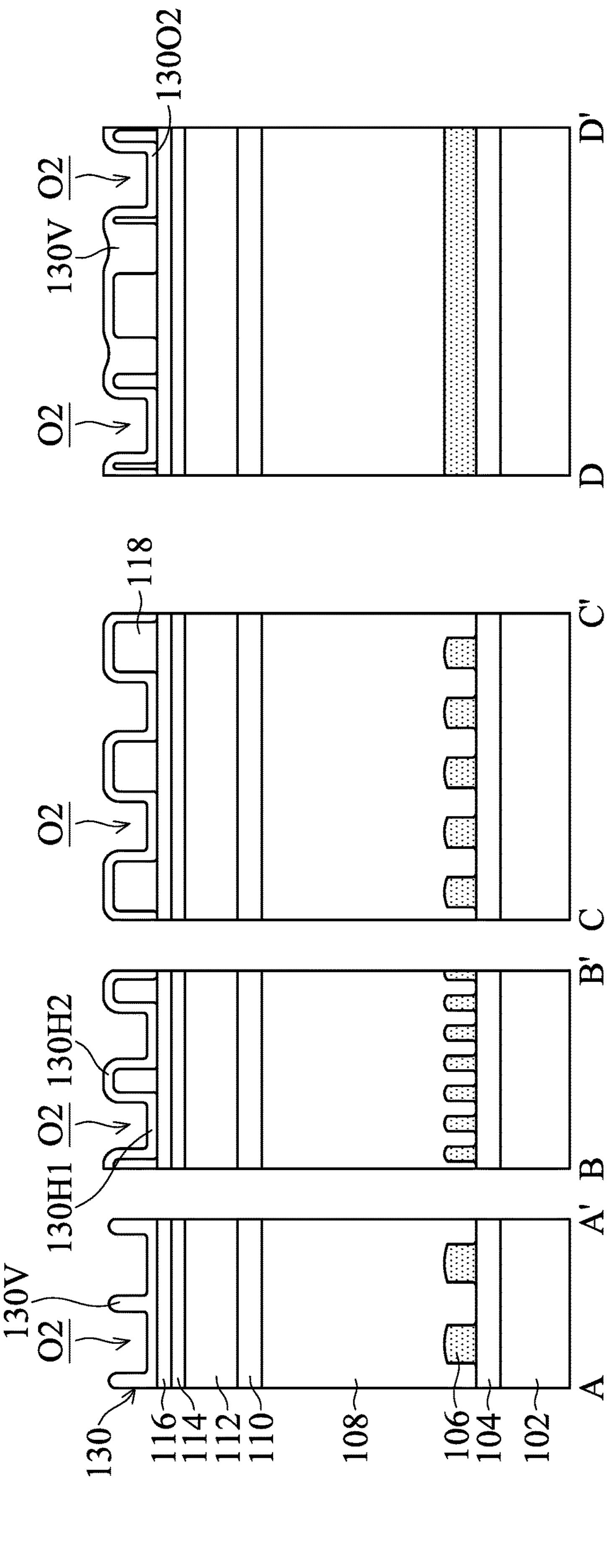

A spacer layer 130 is formed along the sidewalls and upper surface of the second patterned mask layer 118, and along the upper surface of the sixth hard mask layer 116, as shown in FIGS. 5A and 5B. The spacer layer 130 includes first horizontal portions 130H1 along the upper surface of the sixth hard mask layer 116, second horizontal portions 130H2 along the upper surface of the second patterned mask layer 118, and vertical portions 130V along the sidewalls of the second patterned mask layer 118. The vertical portions 130V of the spacer layer 130 partially fill the trenches T1. The vertical portions 130V merge with each other at the narrower part of the trenches T2 (i.e., the location where adjacent openings O1 are connected). Accordingly, the trenches T2 are cut into a plurality of openings O2 by the vertical portions 130V of the spacer layer 130.

In some embodiments, the spacer layer 130 is made of dielectric material such as silicon oxide (SiO), silicon nitride (SiN), or silicon oxynitride (SiON). The spacer layer 130 is formed using an atomic deposition process (ALD) process, a chemical vapor deposition (CVD) process, or another suitable technique.

Figure 6A:
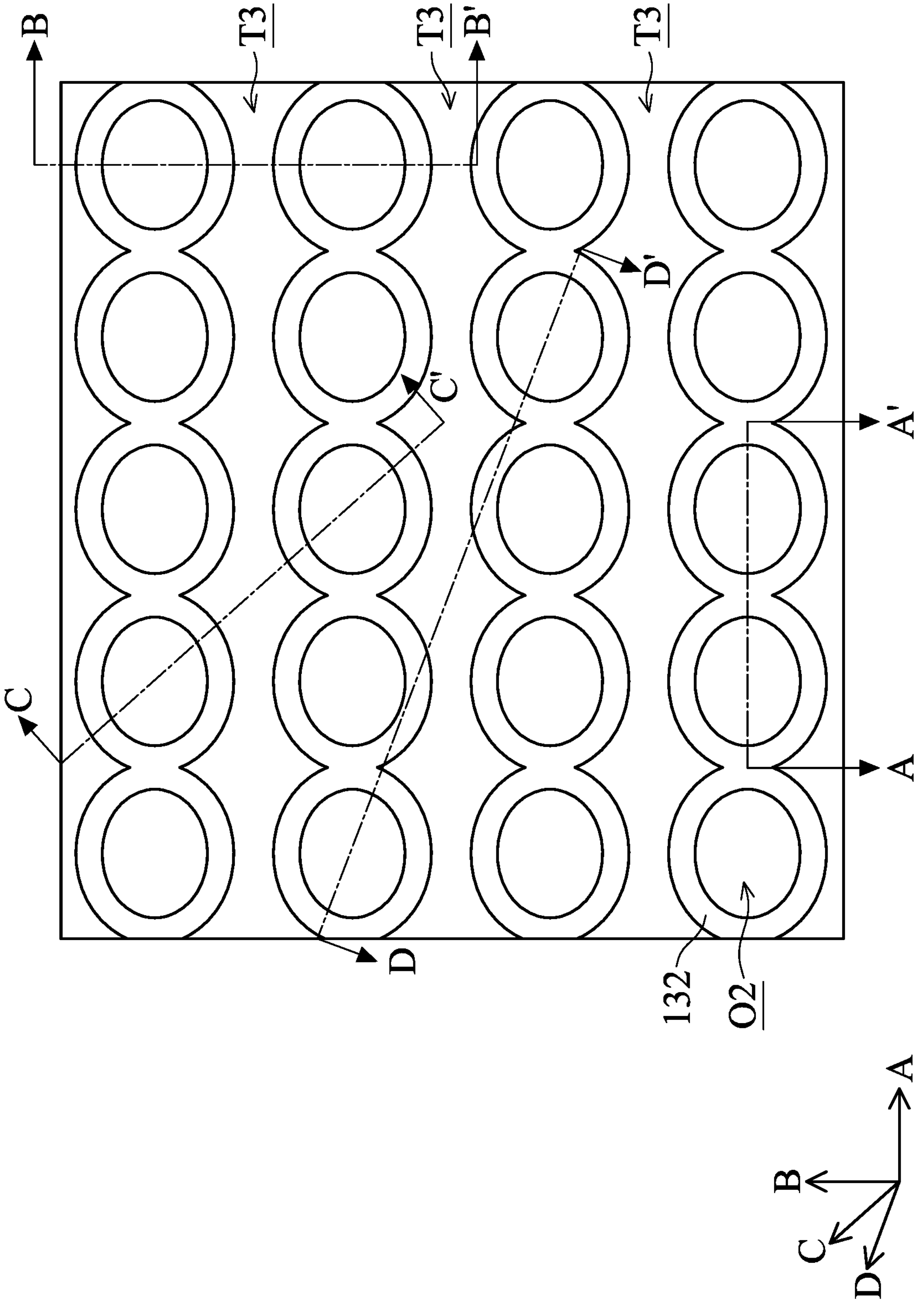
Figure 6B:
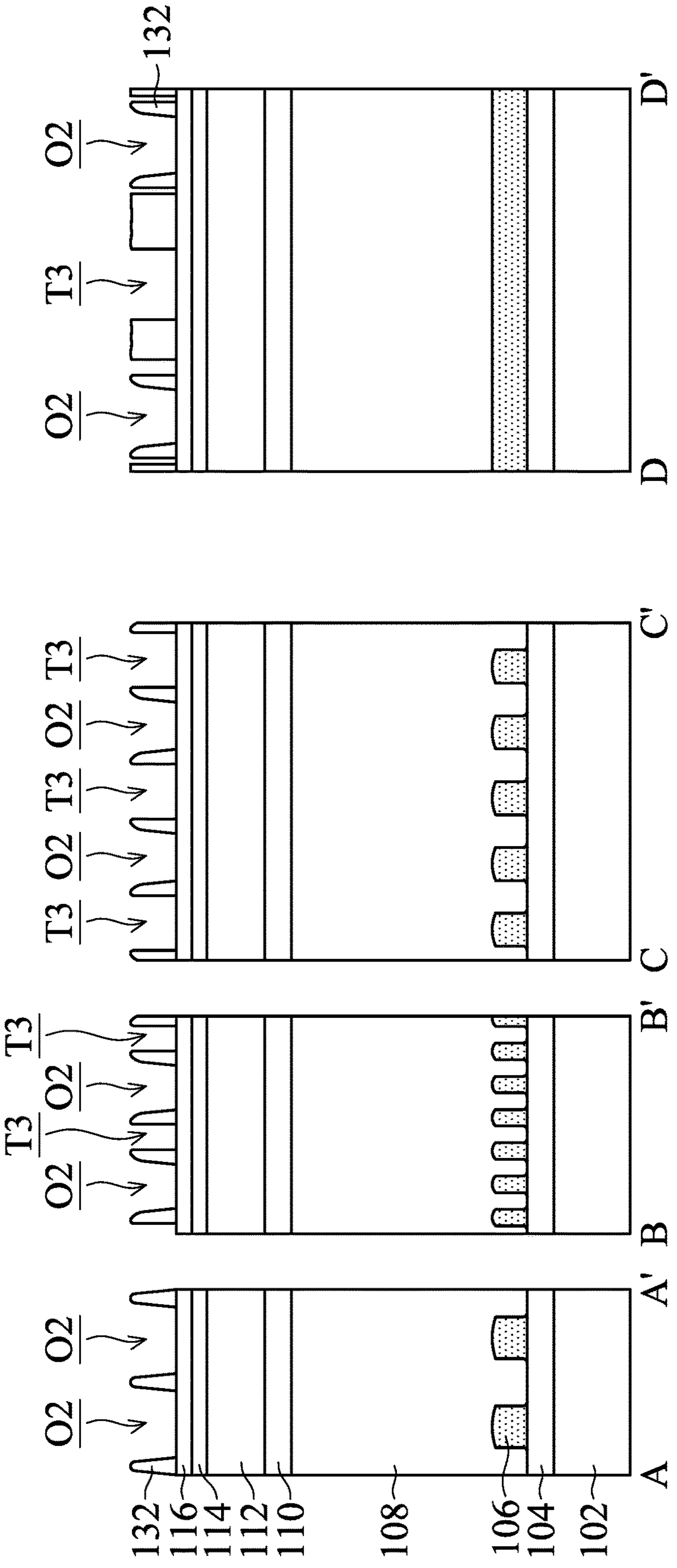

An etching process is performed on the spacer layer 130 to remove the first horizontal portions 130H1 and the second horizontal portions 130H2 of the spacer layer 130. After the etching process, the vertical portions 130V of the spacer layer 130 remain, and are formed into a plurality of spacers 132. The spacers 132 are spaced apart from each other and extend in the first direction A. An etching process is then performed to remove the second patterned mask layer 118, thereby forming a plurality of trenches T3. The trenches T3 are spaced apart from each other and extend in the first direction A, as shown in FIGS. 6A and 6B.

Figure 7A:
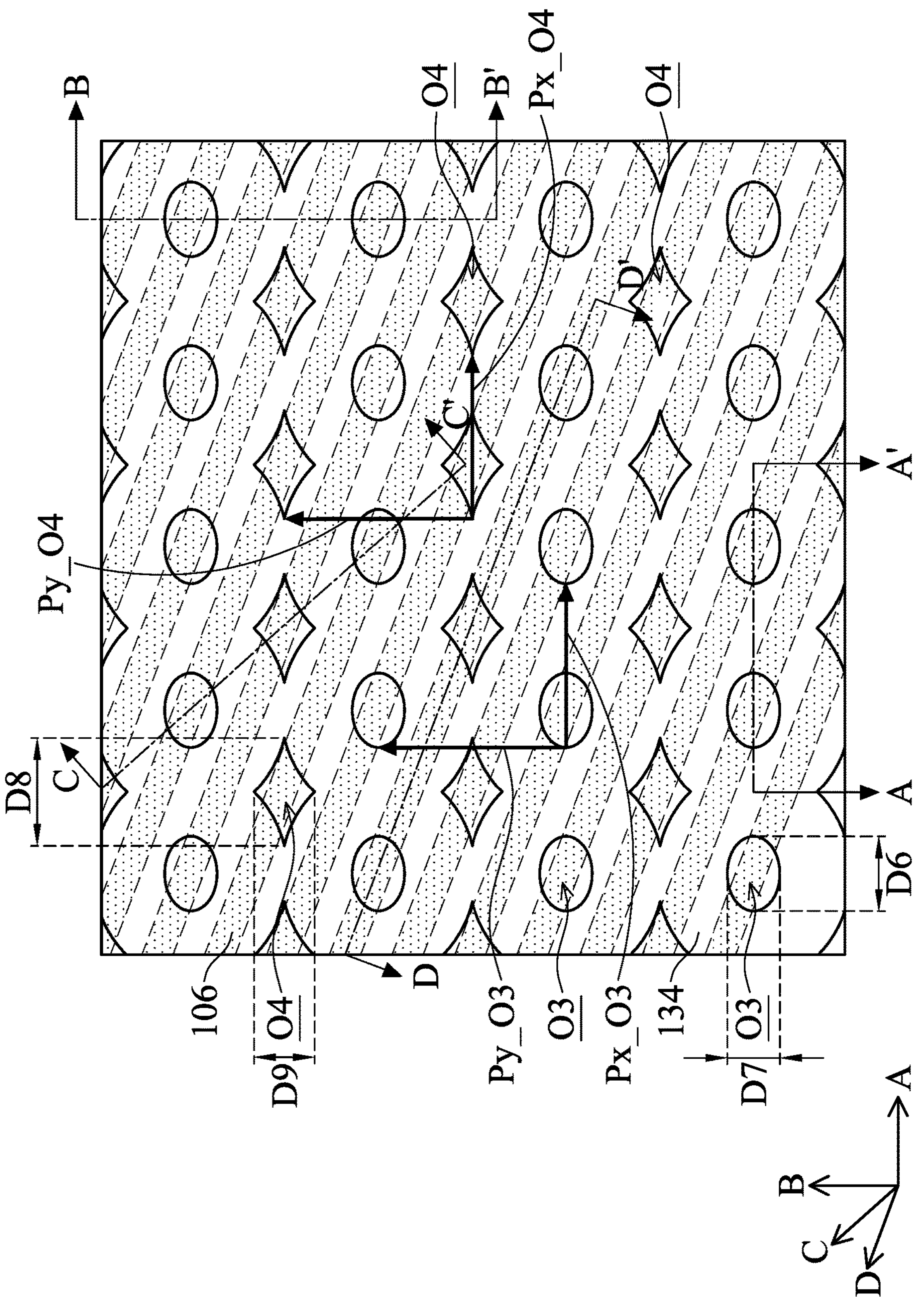
Figure 7B:
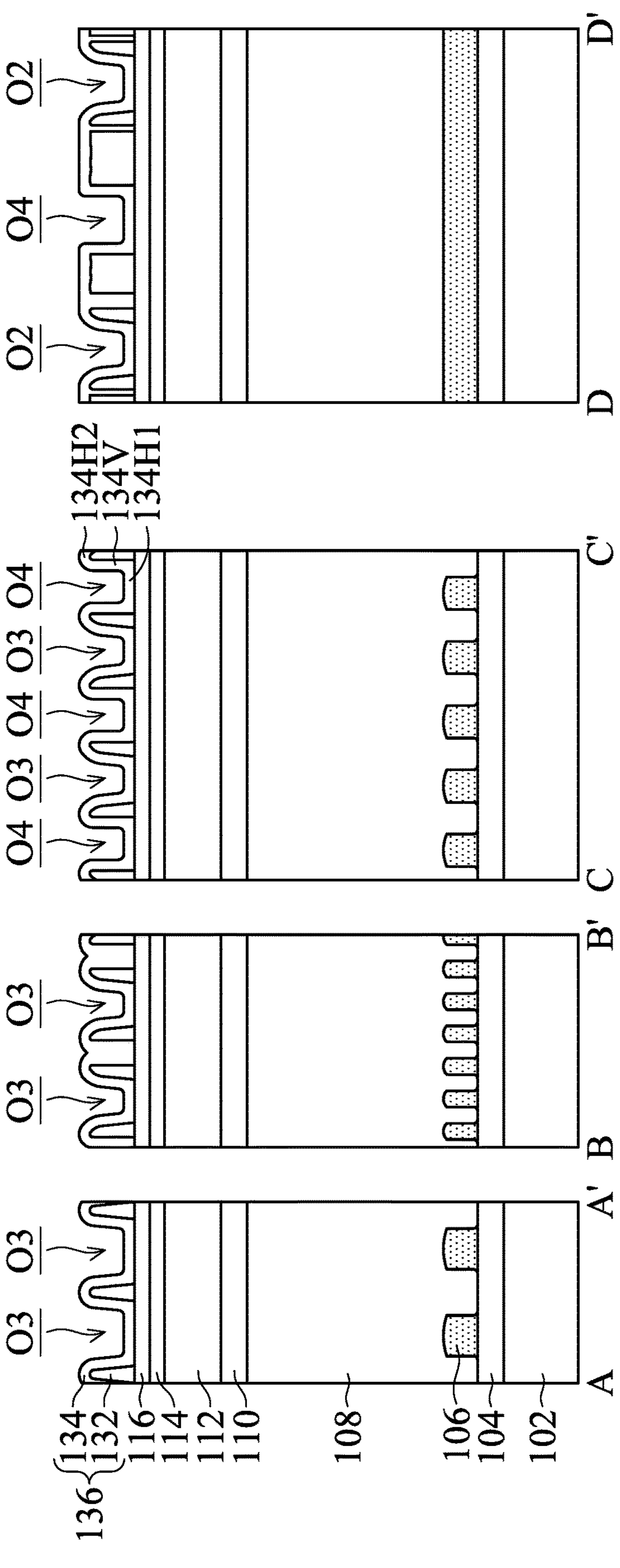
Figure 8A:
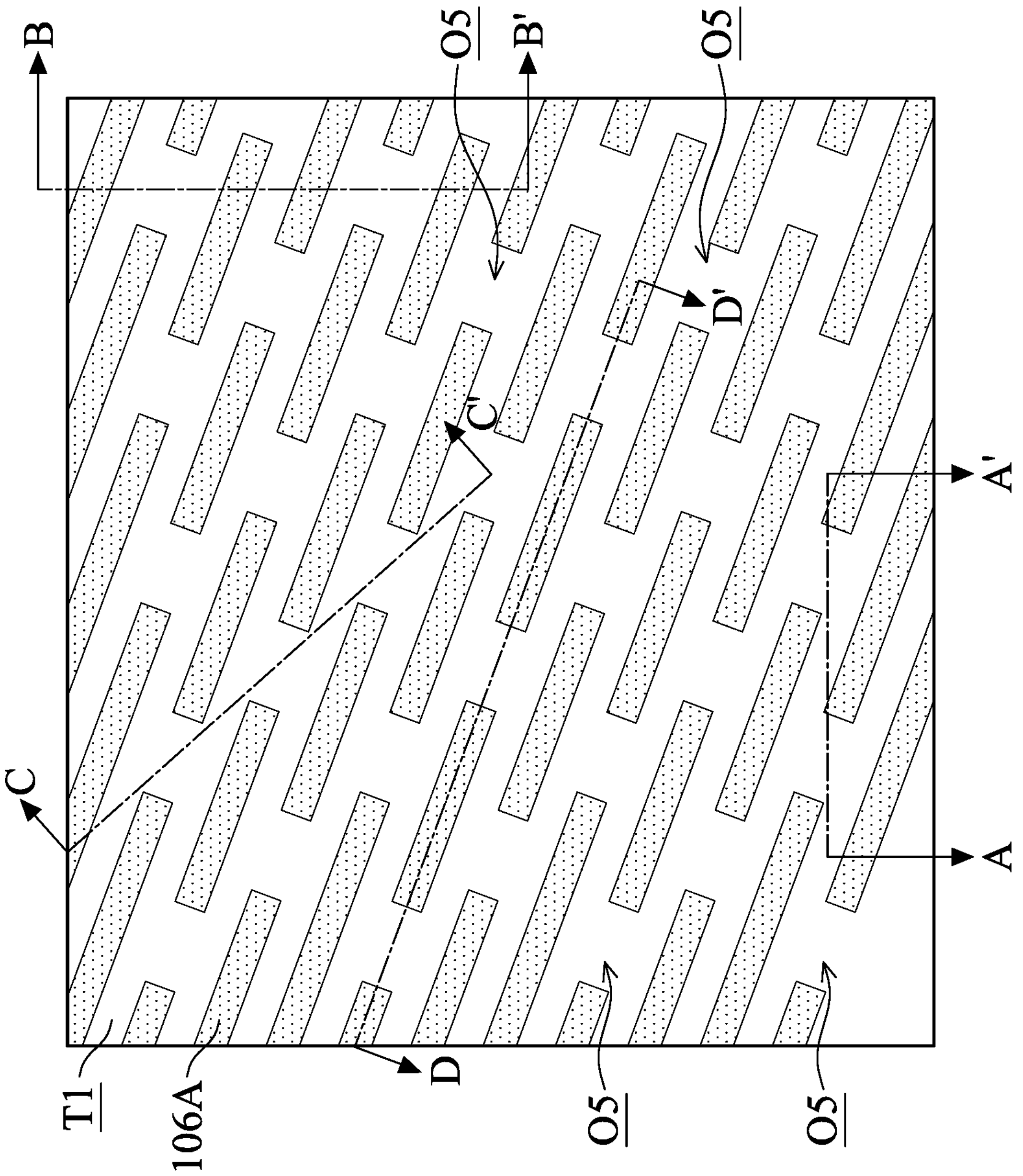
Figure 8B:
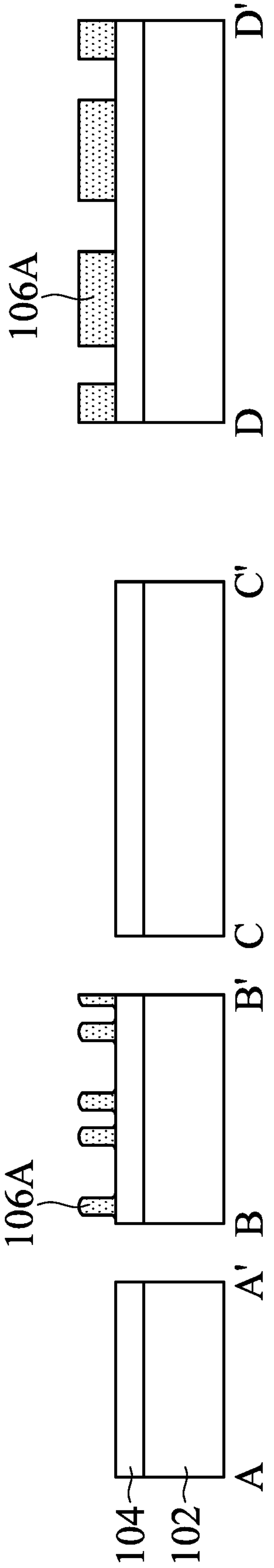

A conformal layer 134 is formed along the sidewalls and upper surfaces of the spacers 132, and along the upper surface of the sixth hard mask layer 116, as shown in FIGS. 7A and 7B. The conformal layer 134 includes first horizontal portions 134H1 along the upper surface of the sixth hard mask layer 116, second horizontal portions 134H2 along the upper surfaces of the spacers 132, and vertical portions 134V along the sidewalls of the spacers 132. The conformal layer 134 may also be referred to as a second spacer layer.

The vertical portions 134V of the conformal layer 134 partially fill the openings O2 and the trenches T3. The shrink openings O2 are denoted as openings O3. The vertical portions 134V of the conformal layer 134 merge with each other at the narrower part of the trenches T3, so that one trench T3 is cut by the vertical portions 134V of the conformal layer 134 into several openings O4 in a row. The openings O3 and the openings O4 overlap the strip patterns of the first patterned mask layer 106. The openings O3 may be referred to as core patterns, and the openings O4 may be referred to as gap patterns. The conformal layer 134 and the spacers 132 together serve as a third patterned mask layer 136. The patterned mask layer 136 having the core patterns and the gap patterns is configured as a mask for subsequent etching processes.

In some embodiments, the conformal layer 134 is made of dielectric material such as silicon oxide (SiO), silicon nitride (SiN), or silicon oxynitride (SiON). The conformal layer 134 is formed using ALD process, a CVD process, or another suitable technique.

In some embodiments, the openings O3 are arranged in an array in the first direction A and the second direction B, and the openings O4 are arranged in an array in the first direction A and the second direction B. The openings O3 and the openings O4 are alternately arranged in the second direction B and staggered from each other.

The openings O3 have a pitch Px_O3 in the first direction A and a pitch Py_O3 in the second direction B. The pitch Py_O3 is longer than the pitch Px_O3. The openings O4 have a pitch Px_O4 in the first direction A and a pitch Py_O4 in the second direction B. The pitch Py_O4 may be longer than the pitch Px_O4. The pitch Px_O3 is substantially equal to the pitch Px_O4, and the pitch Py_O3 is substantially equal to the pitch Py_O4. The ratio of pitch Px_O3 to Py_O3 (or pitch Px_O4 to Py_O4) may be in a range from about 0.75 to about The openings O3 have a dimension D6 in the first direction A and a dimension D7 in the second direction B. The dimension D6 of the openings O3 is longer than the dimension D7 of the openings O3. The openings O3 formed from the openings O1 also have oval-like outlines or eye-like outlines. The ratio of the dimension D6 to the dimension D7 may be in a range from about 1.1 to about 1.5. The openings O4 have a dimension D8 in the first direction A and a dimension D9 in the second direction B. The dimension D8 of the openings O4 is longer than the dimension D9 of the openings O4. The openings O4 are formed from the gaps between the four openings O3, thus having rhombus-like outlines. The ratio of the dimension D8 to the dimension D9 may be in a range from about 1.1 to about 1.5. The dimension D6 of the openings O3 is substantially equal to the dimension D8 of the openings O4, and the dimension D7 of the openings O3 is substantially equal to the dimension D9 of the openings O4.

According to the embodiments of the present disclosure, the openings O1 (FIG. 2A) have a relatively large pitch in the second direction B (e.g., Py_O1>Px_O1) while the openings O1 have a relatively large size in the first direction A (e.g., D4>D5), so that the openings O4, located at the gaps, can be formed with a relatively large size. For example, openings O4 have substantially the same size as the openings O3. If the openings O1 have a relatively large size in the second direction B (e.g., D4<D5), the size of openings O4 would be much smaller than that of the openings O3.

Figure 9A:
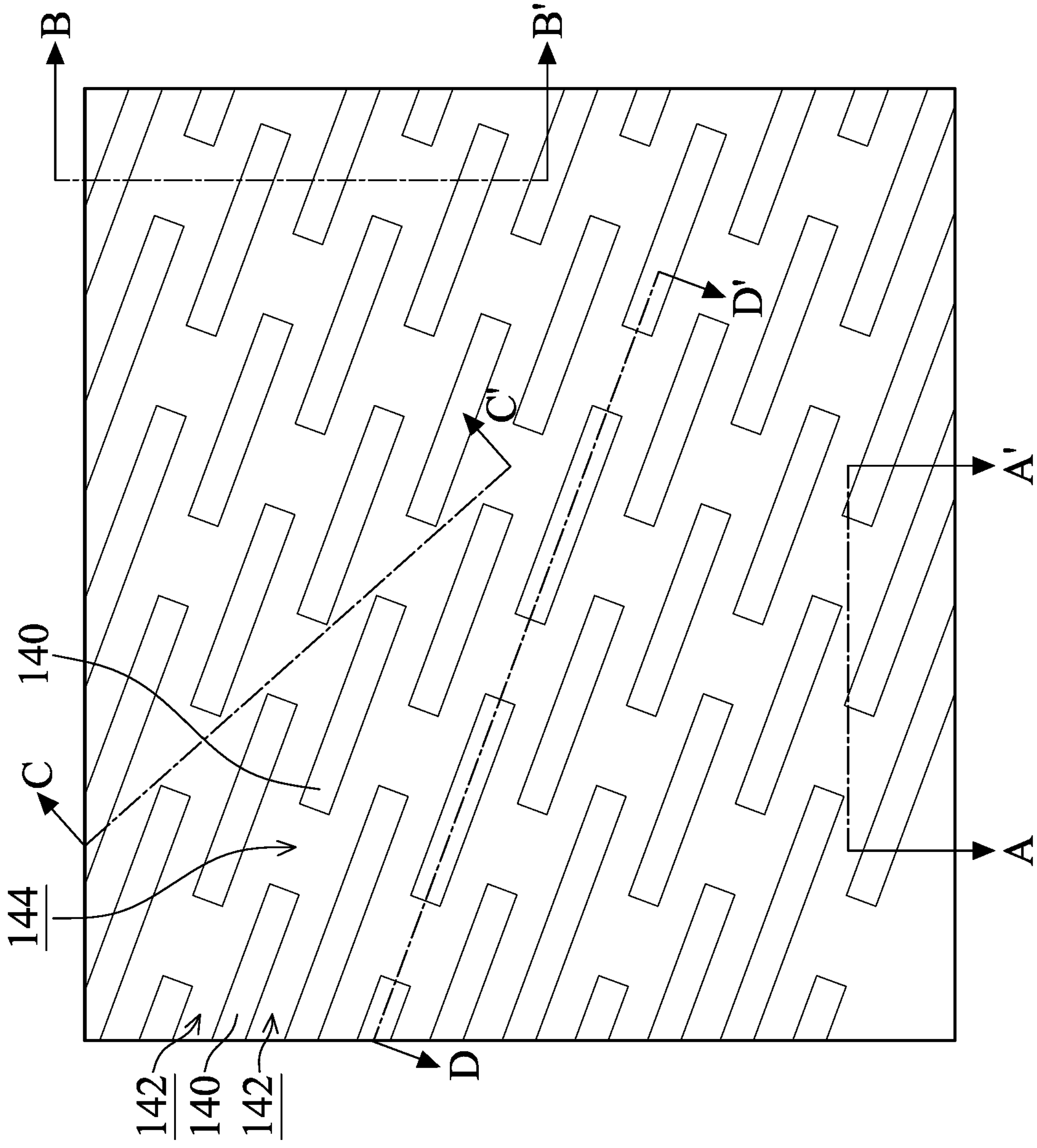
Figure 9B:
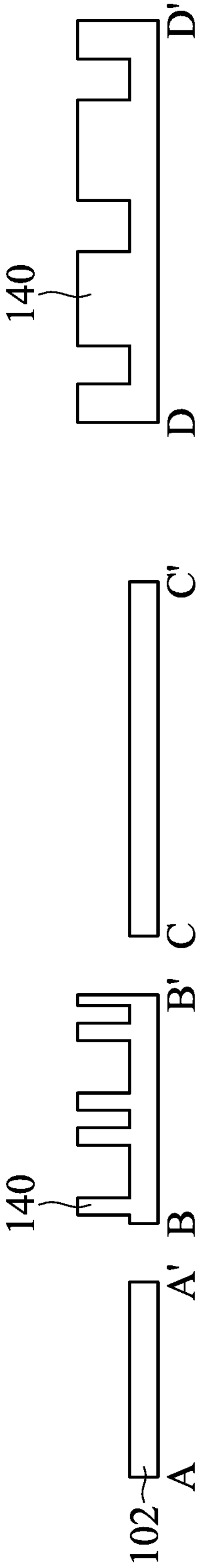

One or more etching processes are performed on the semiconductor structure using the third patterned mask layer 136 to remove respective portions of the sixth mask layer 116, the fifth mask layer 114, the fourth hard mask layer 112, the third hard mask layer 110, the second hard mask layer 108 and the first patterned mask layer 106 exposed from the openings O3 and O4 until the first hard mask layer 104 is exposed, as shown in FIGS. 9A and 9B. The etching processes transfer the openings O3 and O4 of the third patterned mask layer 136 into the first patterned mask layer 106, thereby forming openings O5. The openings O5 cuts off the strip patterns of the first patterned mask layer 106 into a plurality of island patterns 106A.

Since the openings O4 have substantially the same dimensions as the openings O3 in the first direction A and the second direction B, portions of the first patterned mask layer 106 at locations corresponding to the openings O4 can be completely cut off, and the openings O5 of the first patterned mask layer 106 have uniform sizes. If the openings O4 described above in FIGS. 7A and 7B have a smaller size than the openings O3, the openings may have inconsistent sizes, and even the portions of the first patterned mask layer 106 at the locations corresponding to the openings O4 may not be completely cut off.

One or more etching processes are performed on the semiconductor structure using the island patterns 106A to remove respective portions of the first hard mask layer 104 and the semiconductor substrate 102 exposed from the trenches T1 and the openings O5, as shown in FIGS. 9A and 9B. The etching processes transfer the island patterns 106A, the trenches T1 and the opening O5 into the semiconductor substrate 102, thereby forming the active regions 140, the trenches 142 and the trenches 144.

According to the embodiments of the present disclosure, since the openings O5 of the first patterned mask layer 104 have consistent sizes, the trenches 144, corresponding to the openings O5, also has consistent sizes, which helps to make the transistors formed in or on the active regions 140 have uniform performance (e.g., threshold voltage). In addition, the short circuit problem caused by the connection of adjacent active regions 140 may be also reduced, thereby improving the manufacturing yield of the resulted semiconductor memory device.

Additional components may be formed over the semiconductor structure of FIGS. 9A and 9B to produce a semiconductor memory device. For example, buried word lines are formed extending through the active regions 140; bit lines are formed over the active regions; capacitor structures are formed over the bit lines; and/or other suitable components may be formed over the semiconductor structure. In some embodiments, the semiconductor memory device is a DRAM.

As described above, the embodiments of the present disclosure provide the method for forming the semiconductor structure, which is direct to a self-aligned double patterning (SADP) technology. By adjusting the patterns of the photomask used in the lithography process for forming the core layer (i.e., the second patterned mask layer 118) to have the extending portions 206A or 206B, the core patterns (i.e., the openings O1) of the core layer have a larger pitch in the second direction B and a larger size in the first direction A. As a result, the gap patterns (i.e., the opening O4) and the core patterns (i.e., the openings O3) of the spacer layer (i.e., the third patterned mask layer 136) can be formed to have substantially the same size. Therefore, the trenches 144, formed from the gap patterns and the core patterns, can completely cut off the active regions 140, and the trenches 144 have uniform sizes. Therefore, the uniformity of the performance of the resulting semiconductor memory device may improve, and the manufacturing yield of the semiconductor memory device may be enhanced.

What is claimed is:

1. A method for forming a semiconductor structure, comprising:

forming strip patterns over a semiconductor substrate;

forming a patterned mask layer over the strip patterns, wherein the patterned mask layer includes first openings corresponding to the strip patterns, the first openings are arranged in an array in a first direction and a second direction that is perpendicular to the first direction, a first pitch of the first openings in the first direction is smaller than a second pitch of the first openings in the second direction, and a first dimension of at least one of the first openings in the first direction is longer than a second dimension of the at least one of the first openings in the second direction;

forming spacers to partially fill the first openings;

removing the patterned mask layer to form trenches between the spacers;

forming a conformal layer to cover the spacers and partially fill the first openings and the trenches, wherein the conformal layer and the spacers together form a mask, remaining portions of the first openings in the mask have oval-like or eye-like outlines in a top view, and remaining portions of the trenches in the mask have rhombus-like outlines in the top view; and etching the strip patterns using the mask formed by the conformal layer and the spacers, thereby cutting the strip patterns into island patterns.

2. The method for forming the semiconductor structure as claimed in claim 1, further comprising:

performing a trimming process on the patterned mask layer to enlarge the first openings so that at least two of the first openings arranged in the first direction are connected to each other.

3. The method for forming the semiconductor structure as claimed in claim 2, wherein forming the spacers comprises:

forming a spacer layer over the patterned mask layer and partially filling the first openings so that the at least two of the first openings connected are separated by the spacer layer; and removing a portion of the spacer layer over an upper surface of the patterned mask layer, wherein a remaining portion of the spacer layer serves as the spacers.

4. The method for forming the semiconductor structure as claimed in claim 1, wherein after forming the conformal layer to partially fill the trenches, remaining portions of the trenches are formed into second openings which are separated from one another.

5. The method for forming the semiconductor structure as claimed in claim 4, wherein the second openings correspond to the strip patterns, and the second openings are arranged in an array in the first direction and the second direction.

6. The method for forming the semiconductor structure as claimed in claim 4, wherein a third pitch of the second openings in the first direction is smaller than a fourth pitch of the second openings in the second direction, and a third dimension of at least one of the second openings in the first direction is longer than a fourth dimension of the at least one of the second openings in the second direction.

7. The method for forming the semiconductor structure as claimed in claim 1, wherein forming the patterned mask layer comprises:

performing a lithography process using a photomask, wherein the photomask has patterns which are arranged in an array in the first direction and the second direction, and at least one of the patterns includes a body portion and an extending portion protruding from a side of the body portion.

8. The method for forming the semiconductor structure as claimed in claim 7, wherein the extending portion of one of the patterns is connected to the extending portion of another one of the patterns.

9. The method for forming the semiconductor structure as claimed in claim 1, wherein the strip patterns have a third pitch in the first direction and a fourth pitch in the second direction, the third pitch is substantially the same as the first pitch, and the fourth pitch is smaller than the second pitch.

10. The method for forming the semiconductor structure as claimed in claim 1, further comprising:

performing an etching process on the semiconductor substrate using the island patterns to form active regions.

11. A method for forming a semiconductor structure, comprising:

forming first strip patterns over a semiconductor substrate;

forming a hard mask layer over the first strip patterns;

forming a photoresist material over the hard mask layer;

patterning the photoresist material using a photomask so that patterns of the photomask are transferred into the photoresist material to form a patterned photoresist material, wherein at least one of the patterns of the photomask includes a body portion and an extending portion protruding from a side of the body portion, and the patterned photoresist material has first openings corresponding to the first strip patterns;

forming spacers along sidewalls of the first openings;

removing the patterned photoresist material to form trenches between the spacers;

forming a conformal layer over the hard mask layer and along the spacers, wherein the conformal layer and the spacers together form a mask, and wherein, in a top view, remaining portions of the first openings in the mask have oval-like or eye-like outlines, and remaining portions of the trenches in the mask have rhombus-like outlines; and sequentially etching the hard mask layer, the first strip patterns and the semiconductor substrate using the mask formed by the conformal layer and the spacers.

12. The method for forming the semiconductor structure as claimed in claim 11, wherein a dimension of the extending portions is smaller than an optical proximity correction limit of a lithography process for patterning the photoresist material.

13. The method for forming the semiconductor structure as claimed in claim 11, wherein the patterns of the photomask are arranged in an array in a first direction and a second direction perpendicular to the first direction, and a first dimension of the body portion in the first direction is smaller than a second dimension of the body portion in the second direction.

14. The method for forming the semiconductor structure as claimed in claim 13, wherein a first pitch of the patterns of the photomask in the first direction is shorter than a second pitch of the patterns of the photomask in the second direction.

15. The method for forming the semiconductor structure as claimed in claim 11, wherein the at least one of the first openings of the patterned photoresist material has a third dimension in the first direction and a fourth dimension in the second direction, and the third dimension is longer than the fourth dimension.

16. The method for forming the semiconductor structure as claimed in claim 11, wherein the first strip patterns extend in a third direction that is parallel to neither the first direction nor the second direction.

17. The method for forming the semiconductor structure as claimed in claim 11, further comprising:

performing a trimming process on the patterned photoresist material so that the patterned photoresist material has second strip patterns that are separated from one another.

18. The method for forming the semiconductor structure as claimed in claim 11, wherein the trenches are separated from one another.

19. The method for forming the semiconductor structure as claimed in claim 18, wherein the conformal layer is formed to partially fill the trenches so that remaining portions of the trenches are formed into second openings, and the second openings are separated from one another and correspond to the first strip patterns.

20. The method for forming the semiconductor structure as claimed in claim 19, wherein after forming the conformal layer, at least one of the first openings has a first dimension in a direction, at least one of the second openings has a second dimension in the direction, the second dimension is substantially the same as the first dimension and the at least one of the first openings has a different outline than the at least one of the second openings.

* * * * *